United States Patent
Wu et al.

(10) Patent No.: US 7,493,543 B1
(45) Date of Patent: Feb. 17, 2009

(54) DETERMINING TIMING ASSOCIATED WITH AN INPUT OR OUTPUT OF AN EMBEDDED CIRCUIT IN AN INTEGRATED CIRCUIT FOR TESTING

(75) Inventors: Vickie Wu, Cupertino, CA (US); Arnold Louie, Cupertino, CA (US)

(73) Assignee: XILINX, Inc., San Jose, CA (US)

( * ) Notice: Subject to any disclaimer, the term of this patent is extended or adjusted under 35 U.S.C. 154(b) by 383 days.

(21) Appl. No.: 11/490,669

(22) Filed: Jul. 20, 2006

(51) Int. Cl.
  *G06F 11/00* (2006.01)
  *G01R 31/28* (2006.01)
(52) U.S. Cl. .................... 714/738; 714/725; 714/736
(58) Field of Classification Search .................. None
  See application file for complete search history.

(56) References Cited

U.S. PATENT DOCUMENTS 6,541,994 B2 * 4/2003 Masuda .................... 324/765
7,321,249 B2 * 1/2008 Watanabe et al. ........... 327/251
7,406,646 B2 * 7/2008 Sato et al. .................. 714/744

* cited by examiner

*Primary Examiner*—Christine T Tu
(74) *Attorney, Agent, or Firm*—W. Eric Webostad (57) ABSTRACT

Method and system for testing an integrated circuit and more particularly, for determining timing associated with an input or output of an embedded circuit, in an integrated circuit for testing are described. A bit is adjustably delayed with a first adjustable delay to provide a delayed bit. The delayed bit is provided to a bus, such as an input bus for example, of the embedded circuit as a second vector. A third vector is output from the embedded circuit responsive to the second vector. A fourth vector is obtained having second multiple bits. The fourth vector is compared with the third vector to determine a period of delay associated with at least approximately a maximum operating frequency of the embedded circuit.

20 Claims, 10 Drawing Sheets

FIG. 6

DETERMINING TIMING ASSOCIATED WITH AN INPUT OR OUTPUT OF AN EMBEDDED CIRCUIT IN AN INTEGRATED CIRCUIT FOR TESTING

FIELD OF THE INVENTION

One or more aspects of the invention relate generally to integrated circuits and, more particularly, to determining timing associated with an input or output of an embedded circuit in an integrated circuit for testing.

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. Notably, as used herein, "include" and "including" mean including without limitation.

One such FPGA is the Xilinx Virtex® FPGA available from Xilinx, Inc., 2100 Logic Drive, San Jose, Calif. 95124. Another type of PLD is the Complex Programmable Logic Device ("CPLD"). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. Other PLDs are programmed by applying a processing layer, such as a metal layer, that programmably interconnects the various elements on the device. These PLDs are known as mask programmable devices. PLDs can also be implemented in other ways, for example, using fuse or antifuse technology. The terms "PLD" and "programmable logic device" include but are not limited to these exemplary devices, as well as encompassing devices that are only partially programmable.

For purposes of clarity and not limitation, FPGAs are described below though other types of integrated circuits having embedded circuits may be used. FPGAs may include one or more embedded blocks, such as one or more embedded microprocessors. For example, a microprocessor may be located in an area reserved for it, generally referred to as a "processor block."

Heretofore, performance of an embedded block in programmable logic of an FPGA ("FPGA fabric") was determined by building a ring oscillator and measuring timing associated with an input or output of an embedded block. A maximum frequency of operation may be determined from what is known as a Minimum Cycle Time of the ring oscillator. In other words, the minimum time in which a signal cycles through the ring oscillator may be used to determine a maximum frequency of operation of an embedded block included as part of the ring of the ring oscillator. Unfortunately, as embedded blocks become more complex, it becomes more problematic to test to find a Minimum Cycle Time as associated with a particular active path in an embedded block. For example, an embedded block may involved complex input sequences to operate properly. Or, it may take many cycles to observe results of testing.

Accordingly, it would be desirable and useful to provide means for determining timing associated with a maximum frequency of operation of an embedded block in an integrated circuit that is not as constrained by complex input sequences or has less test cycle latency or both than in the past.

SUMMARY OF THE INVENTION

One or more aspects of the invention generally relate to integrated circuits and, more particularly, to determining timing associated with an input or output of an embedded circuit in an integrated circuit.

An aspect of the invention is a method for testing an integrated circuit. A first vector is obtained having first multiple bits. The first vector is pipelined to provide a pipelined version of the first vector responsive to a clock signal. A bit of the first multiple bits of the pipelined version of the first vector is provided to a first adjustable delay. A remainder of the first multiple bits of the pipelined version of the first vector is provided to an input bus of an embedded circuit, the embedded circuit being provided as part of the integrated circuit. The bit is adjustably delayed with the first adjustable delay to provide a delayed bit that is delayed with respect to the remainder of the first multiple bits. The delayed bit is provided to the input bus of the embedded circuit. The first multiple bits including the delayed bit are provided to the input bus as a second vector. A third vector is output from the embedded circuit responsive to the second vector. A fourth vector is obtained having second multiple bits. The fourth vector is compared with the third vector to determine a first minimum period of delay associated with at least approximately a maximum operating frequency of the embedded circuit.

Another aspect of the invention is another method for testing an integrated circuit. A first vector having first multiple bits is obtained by an input bus of an embedded circuit, the embedded circuit being provided as part of the integrated circuit. A second vector having second multiple bits is output from an output bus of the embedded circuit responsive to the first vector and to a clock signal. A bit of the second multiple bits of the second vector is provided to a first adjustable delay. A remainder of the second multiple bits is provided to a pipeline. The bit is adjustably delayed with the first adjustable delay to provide a delayed bit that is delayed with respect to the remainder of the second multiple bits. The delayed bit is provided to the pipeline. The second multiple bits including the delayed bit are provided to the pipeline as a third vector. The third vector is provided from the pipeline responsive to the clock signal. A fourth vector having third multiple bits is obtained. The fourth vector is compared with the third vector to determine a first minimum period of delay associated with at least approximately a maximum operating frequency of the embedded circuit.

Yet another aspect of the invention is a test system for an integrated circuit. The system includes: a first storage device is for storing a first vector of a set of function verification vectors; an embedded circuit under test; a comparison circuit; a second storage device for storing a set of expected results vectors associated with the set of function verification vectors; and a delay macro for programming programmable logic to provide a delay line. The delay line is programmable to adjust delay of the delay line. The delay macro is programmably coupled to receive a bit signal and is configured to provide a delayed bit signal. The bit signal is from a first vector of the set of function verification vectors. The storage device, the delay line, and the embedded circuit operate with reference to a same clock signal. The embedded circuit is coupled to receive the first vector with the delayed bit signal and is configured to provide a second vector in response to the first vector with the delayed bit signal. The comparison circuit is coupled to receive the second vector and a third vector, the third vector being from the set of expected results vectors and being associated with the first vector. The comparison circuit is configured to compare the second vector with the third vector to identify at least approximately a first maximum frequency of operation of the embedded circuit for input to an input bus thereof.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1:
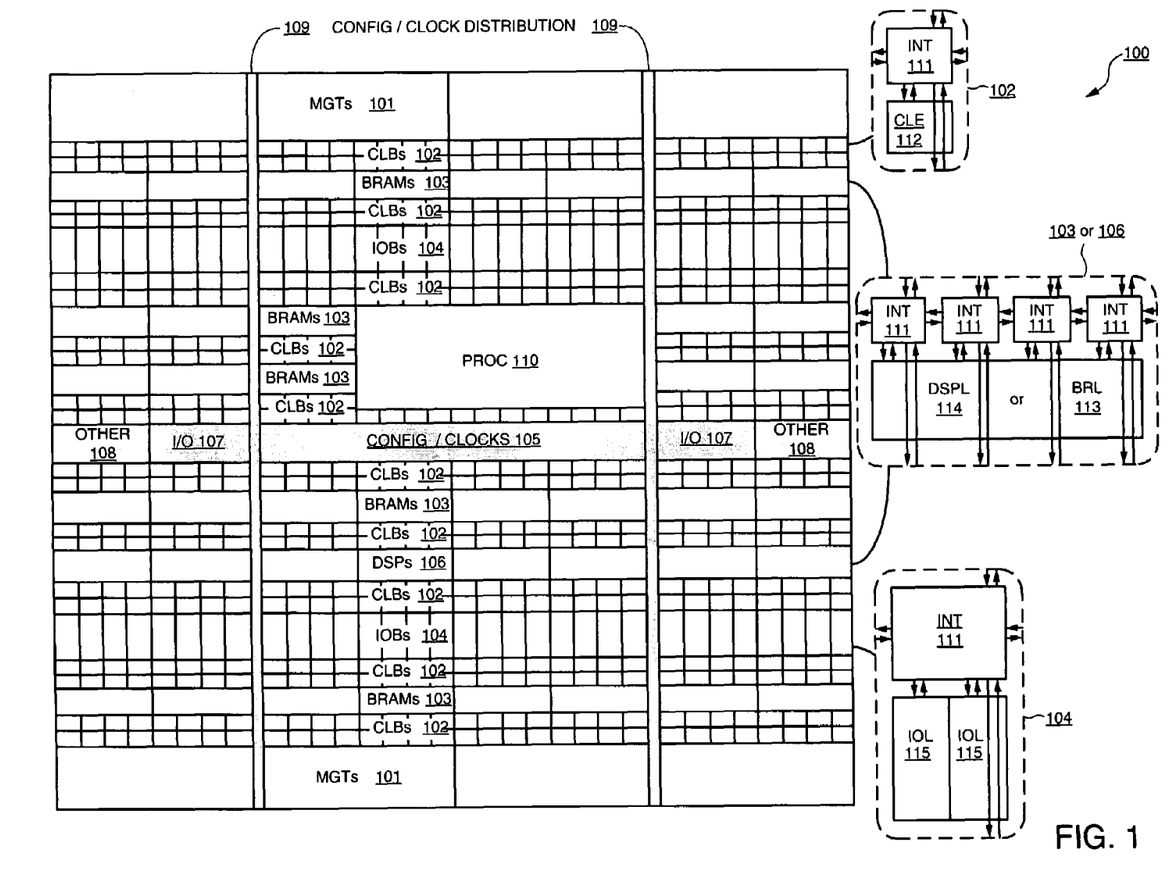
FIG. 1 is a simplified block diagram depicting an exemplary embodiment of a columnar Field Programmable Gate Array ("FPGA") architecture in which one or more aspects of the invention may be implemented.

FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output ports ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element 111 in each adjacent tile. Therefore, the programmable interconnect elements 111 taken together implement the programmable interconnect structure for the illustrated FPGA. Each programmable interconnect element 111 also includes the connections to and from any other programmable logic element(s) within the same tile, as shown by the examples included at the right side of FIG. 1.

For example, a CLB 102 can include a configurable logic element ("CLE") 112 that can be programmed to implement user logic plus a single programmable interconnect element 111. A BRAM 103 can include a BRAM logic element ("BRL") 113 in addition to one or more programmable interconnect elements 111. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element ("DSPL") 114 in addition to an appropriate number of programmable interconnect elements 111. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 are manufactured using metal layered above the various illustrated logic blocks, and typically are not confined to the area of the I/O logic element 115.

In the pictured embodiment, a columnar area near the center of the die (shown shaded in FIG. 1) is used for configuration, I/O, clock, and other control logic. Vertical areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the right side of FIG. 1 are purely exemplary. For example, in an actual FPGA more than one adjacent column of CLBs is typically included wherever the CLBs appear, to facilitate the efficient implementation of user logic. FPGA 100 illustratively represents a columnar architecture, though FPGAs of other architectures, such as ring architectures for example, may be used. FPGA 100 may be a Virtex-4™ FPGA from Xilinx of San Jose, Calif.

Examples of complex circuit blocks that may be included in an FPGA, in addition to a microprocessor, include for example an Ethernet media access control ("EMAC") block and a Peripheral Component Interconnect ("PCI") block, among other known types of blocks. Furthermore, variations of these blocks, for example a PCI Express ("PCIe") block, may be used. Notably, although these examples are used, other known complex circuits may be embedded as circuit blocks in an integrated circuit. The integrated circuit in which such blocks may be embedded may be an FPGA; however, other known integrated circuits have complex circuit blocks embedded in them, and they too may be used. Sometimes an integrated circuit with one or more embedded blocks is referred to as a "System-on-Chip" ("SoC"). The example of an FPGA is used to describe how a Built-In Self-Test ("BIST") circuit may be implemented using programmable logic. This programmable logic used to provide the BIST circuit may thereafter be returned to a pool of resources after testing, where such pool of resources may be available to a user. However, it should be appreciated that either or both programmable logic or hardwired logic may be used for implementing the BIST circuit described. In the example of hardwired logic, such BIST circuit may be optioned out, using one-time programmable elements, such as fuses for example, after testing. Furthermore, although an FPGA example is described herein, programmable logic in other types of integrated circuits may be used to provide a BIST circuit as described herein.

Figure 2A:
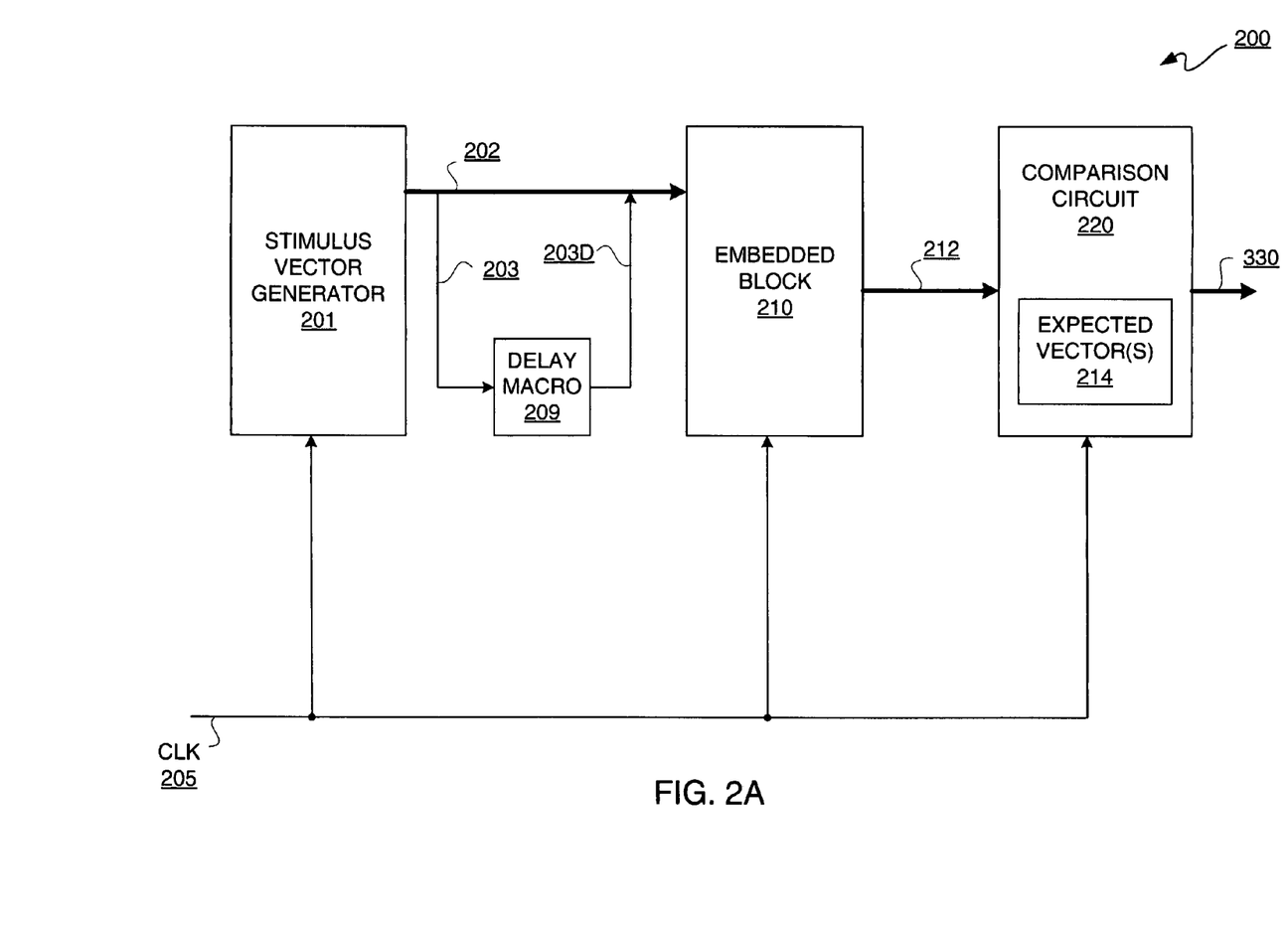
FIG. 2A is a block diagram depicting an exemplary embodiment of an integrated circuit having a Built-In Self-Test ("BIST") circuit provided in part using a delay macro for an input side of an embedded block.
Figure 2B:
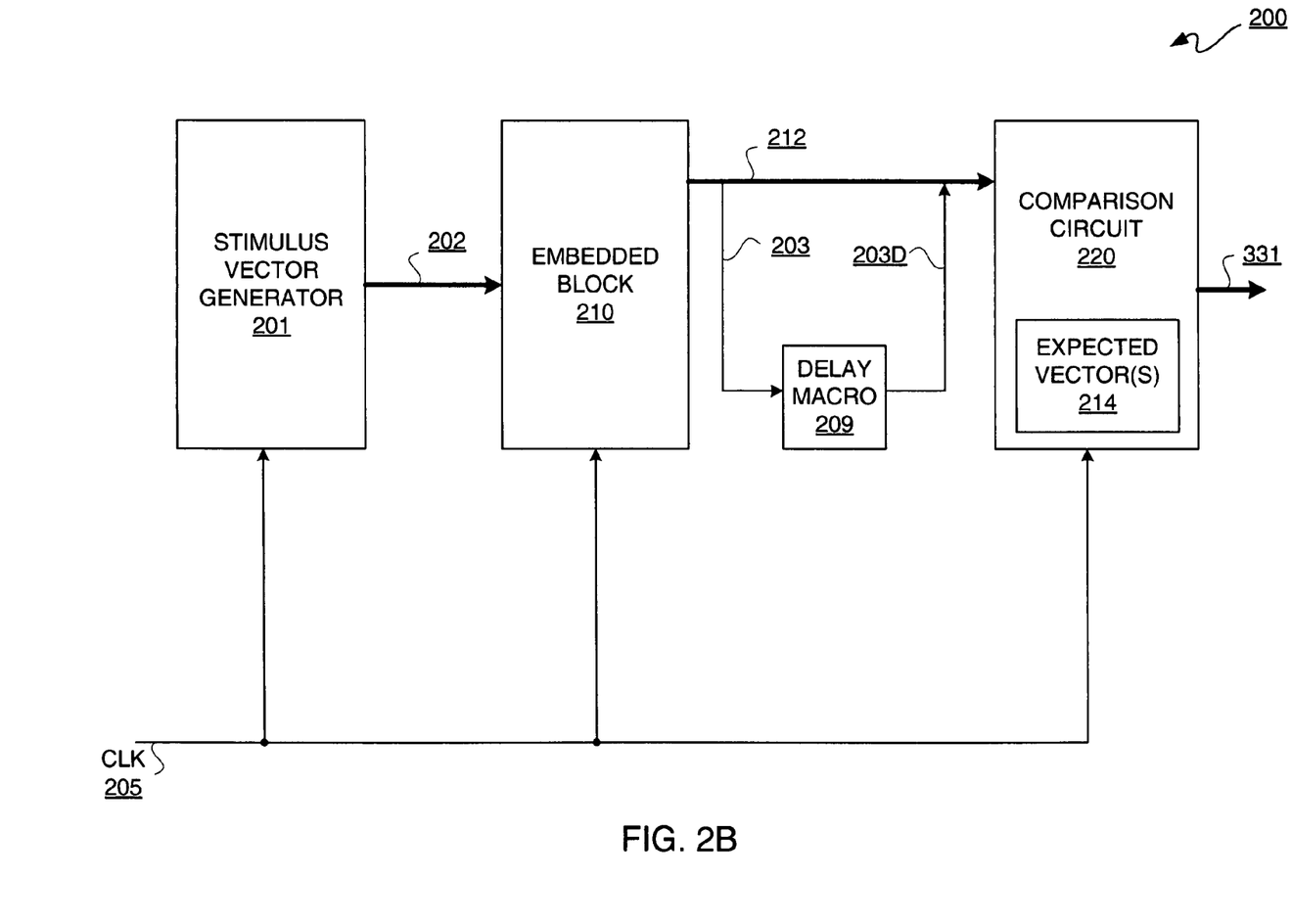
FIG. 2B is a block diagram depicting an exemplary embodiment of the integrated circuit of FIG. 2A having a BIST circuit provided in part using the delay macro of FIG. 2A, although for an output side of the embedded block of FIG. 2A.

FIG. 2A is a block diagram depicting an exemplary embodiment of an integrated circuit 200 having a BIST circuit provided in part using delay macro 209. In this example embodiment, delay macro 209 is for an input side of an embedded block 210. FIG. 2B is a block diagram depicting an exemplary embodiment of integrated circuit 200 having a BIST circuit provided in part using delay macro 209 for an output side of an embedded block 210. Integrated circuit 200 is described in additional detail with simultaneous reference to FIGS. 2A and 2B.

A clock signal 205 is provided to stimulus vector generator 201, embedded block 210, and comparison circuit 220. Thus, it should be appreciated that synchronous operation may be responsive to clock signal 205. Stimulus vector generator 201 provides a stimulus vector 202, one at a time, to embedded block 210. Stimulus vector 202 may be a number of bits in width. Any one bit 203 of such bits may be provided to delay macro 209 in FIG. 2A.

Delay macro 209, as indicated in FIG. 2A, receives a bit 203 of stimulus vector 202 and delays it prior to returning such bit 203D back to stimulus vector 202. Thus, embedded block 210 receives stimulus vector 202, but with one bit 203D delayed more than all of the other bits of stimulus vector 202. Embedded block 210 may receive stimulus vector 202 to any type of signal input bus thereof, such as an address, control, or data bus for example. The bit of stimulus vector 202 selected for additional delay, namely bit 203D, may be identified using static timing analysis. Thus, a bit having the most likely impact on frequency of operation from all bits of stimulus vector 202 may be identified. Alternatively, each bit of stimulus vector 202 may be tested, for example sequentially, to determine which bit has the most impact on frequency of operation with respect to embedded block 210.

With continuing reference to FIG. 2A, embedded block 210, responsive to receiving stimulus vector 202 with one of the bits delayed by delay macro 209, provides outcome vector 212. Thus, outcome vector 212 is provided by embedded block 210 responsive to processing stimulus vector 202. Outcome vector 212 may be provided to a comparison circuit 220. Comparison circuit 220 may be configured to compare outcome vector 212 with an expected vector 214 in association with stimulus vector 202. In other words, stimulus vector 202 may be a function verification input vector for verifying function of embedded block 210. Outcome vector 212 of embedded block 210, responsive to a function verification input, namely stimulus vector 202, has an expected result, namely an expected vector 214, with which comparison circuit 220 may compare outcome vector 212. Notably, comparison circuit 220 may have access to a store of expected vectors 214. Thus, stimulus vector generator 201 may be a function data generator, and comparison circuit 220 may be used to verify proper operation of embedded block 210 prior to testing for a maximum frequency of operation, namely prior to insertion of an added delay.

With reference to FIG. 2B, in this example, stimulus vector 202 is provided from stimulus vector generator 201 to embedded block 210 without delaying any bits. In this example, the output side of embedded block 210 provides outcome vector 212 responsive to stimulus vector 202. A bit 203 of outcome vector 212 is provided to delay macro 209. This bit 203 provided to delay macro 209 is delayed and provided back to outcome vector 212 for input of outcome vector 212 with such a delayed bit 203D to comparison circuit 220. Comparison circuit 220 may then compare outcome vector 212 with an expected vector 214 as described above.

With reference to FIGS. 2A and 2B, outcome of comparison circuit 220 may be used to indicate the frequency at which an input or output as associated with embedded block 210, respectively, fails before other associated inputs or outputs. Thus, the signal passing into or out of an associated input or output pin of an embedded block that fails before other signals of the same signal bus is the frequency limiting signal. Delay macro 209 is adjustable to determine at what point of added delay to a signal, whether an input signal or an output signal, such signal fails because the expected bit value in an expected vector for that signal is incorrect. Accordingly, the resultant vectors 330 and 331 provided from comparison circuit 220 indicate a maximum frequency of operation. As described with respective reference to FIGS. 2A and 2B, an input side or an output side of embedded block 210 may be tested to determine when a signal associated with a pin of a bus fails. Accordingly, as there may be multiple stimulus vectors 202 for an embedded block 210, there may be multiple associated expected vectors 214 for such stimulus vectors 202. Thus, it should be appreciated that which pin of a signal bus may be tested may depend upon the particular stimulus vector used. Additionally, it should be appreciated that there may be multiple signal buses for an embedded block 210. Accordingly, the pin being tested may change responsive to the signal bus used.

Thus, by providing a test pattern from stimulus vector generator 201 for a programmed added delay provided via delay macro 209, resultant data may be compared with expected results. The test pattern may be provided with increases in clock frequency of clock signal 205 for the added delay setting until the resultant data does not match the expected results. Moreover, the added delay setting provided by delay macro 209 may be increased or decreased, and the testing with increasing clock frequency repeated.

Figure 3A:
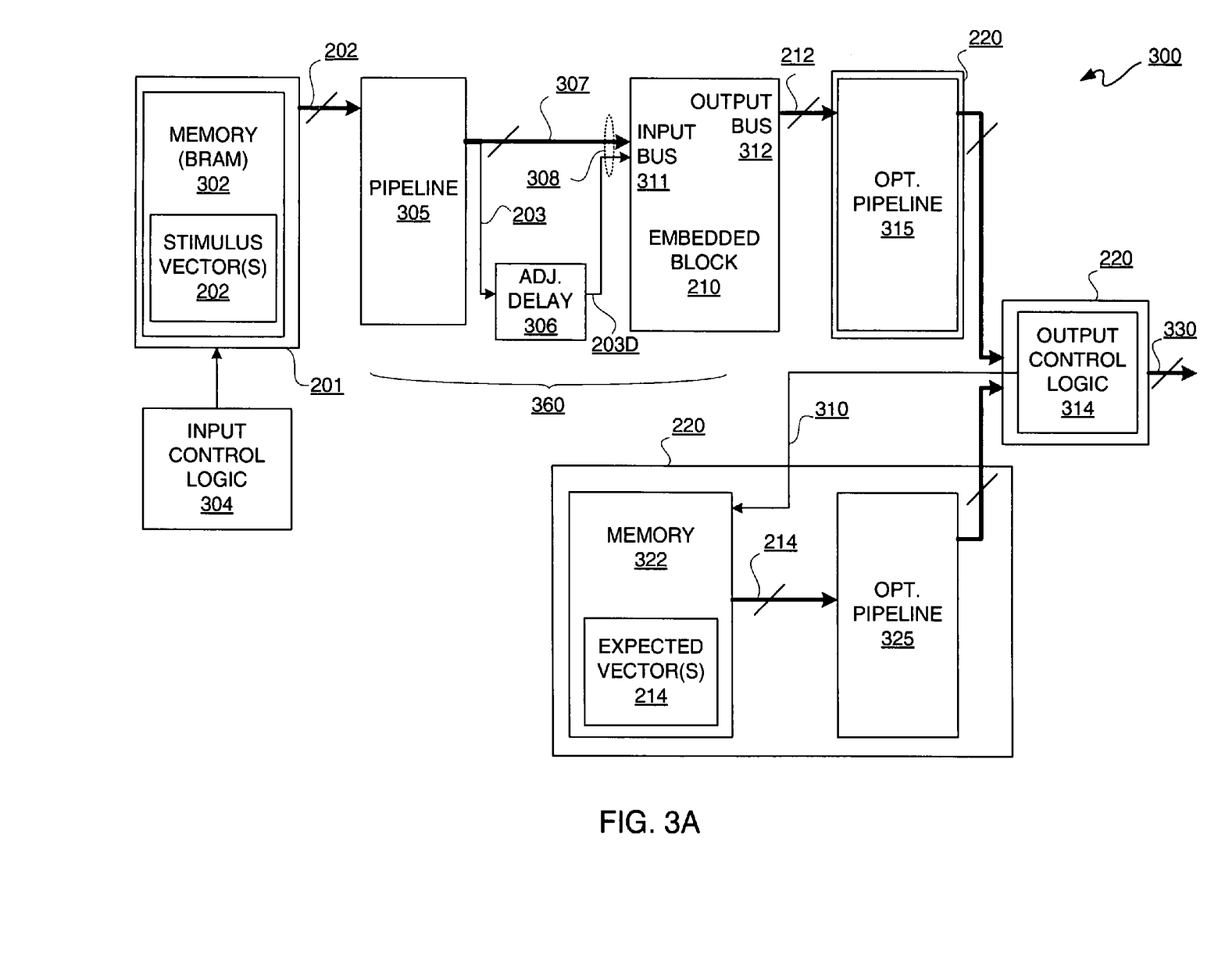
FIG. 3A is a block diagram depicting an exemplary embodiment of the input side BIST circuit of FIG. 2A.

To more clearly understand an example of how a BIST circuit as described above may be implemented, FIGS. 3A and 3B are block diagrams depicting exemplary embodiments of input side BIST circuit 300 and output side BIST circuit 320, respectively. With reference to FIG. 3A, input side BIST circuit 300 is further described. Notably, input side BIST circuit 300 is described in terms of an FPGA implementation; however, as indicated above, other types of integrated circuits may be used. In this example, BIST circuit 300 is used to determine a maximum frequency associated with an input pin of an input bus 311 of embedded block 210. It should be appreciated that as the frequency of a clock signal, such as clock signal 205 of FIGS. 2A and 2B is increased, input or output paths may fail within a reasonable frequency range. Thus, the maximum frequency of operation of embedded block 210 may be determined by identifying an input that, when delayed, fails before all other inputs of the same signal bus.

In this example, input control logic 304, which may be implemented in programmable logic of an FPGA, is used to control a stimulus vector generator 201. Stimulus vector generator 201 may be implemented in programmable logic or memory 302, or a combination thereof. For this example, memory 302 is used. Memory 302 for an FPGA implementation may be BRAM. However, it should be appreciated that other types of memory may be used. Memory 302 may be used for storing one or more stimulus vectors 202. Responsive to control by input control logic 304, which may receive clock signal 205 of FIGS. 2A and 2B, a stimulus vector 202 of bit width [N:0], for N a positive integer greater than 0, is provided to pipeline 305. Pipeline 305 may be implemented using programmable logic. More particularly, pipeline 305 may include (N+1) flip-flops, which may be formed in whole or in part in programmable logic, in parallel.

Figure 6:
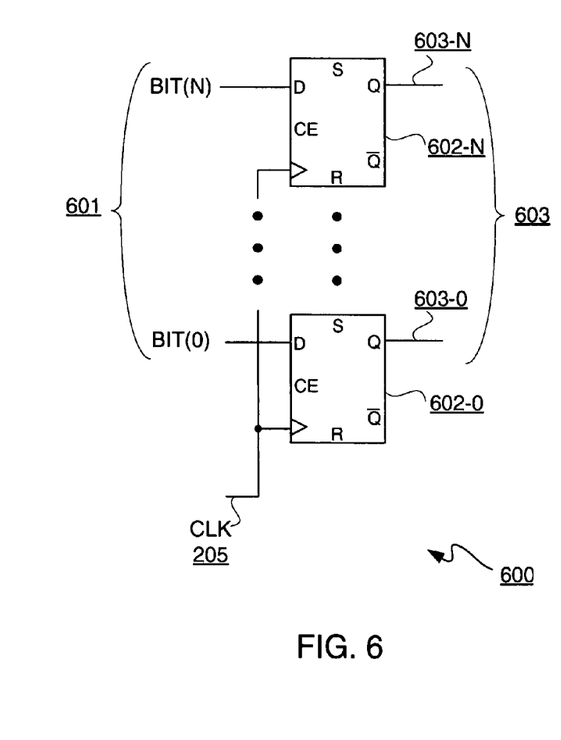
FIG. 6 is a circuit diagram depicting an exemplary embodiment of a pipeline, such as the pipeline of FIG. 3A.

FIG. 6 is a circuit diagram depicting an exemplary embodiment of a pipeline 600. Pipeline 600 may be used to implement pipeline 305 of FIG. 3A. Pipeline 600 is clocked responsive to clock signal 205 where a bit from each of the bits 0 through N of an input vector 601 is provided to a respective data input port of flip-flops 602-0 through 602-N.

With renewed reference to FIG. 3A and continuing reference to FIG. 6, one of outputs 603-0 through 603-N of outputs 603, namely bit 203, is provided to an adjustable delay 306, and the remainder of output 603 is provided directly to an input bus 311 of an embedded block 210. Notably, delay macro 209 may instantiate a pipeline, such as pipeline 305, and an adjustable delay, such as adjustable delay 306, in programmable logic.

N bits of pipeline vector 307 are provided directly from pipeline 305 to input bus 311 of embedded block 210, and a bit 203 output from pipeline 305 is provided to adjustable delay 306, which delays such bit prior to providing such bit 203D to input bus 311 of embedded block 210. In this particular example, the 0th bit is used; however, it should be appreciated that any of the bits output from pipeline 305 may be coupled to be delayed by adjustable delay 306.

Figure 7:
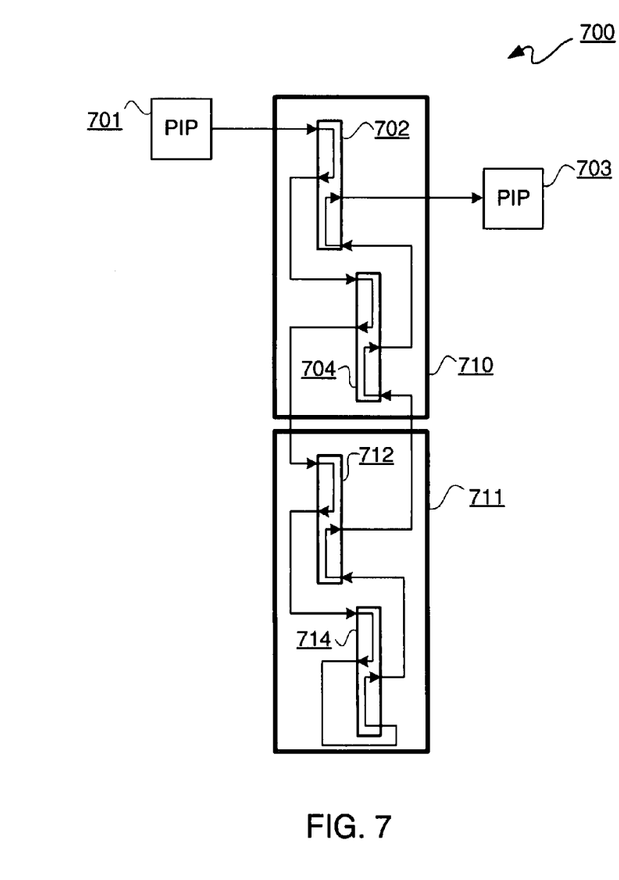
FIG. 7 is a block diagram depicting an exemplary embodiment of instantiation of a delay macro, such the delay macro of FIGS. 2A and 2B, in programmable logic.

FIG. 7 is a block diagram depicting an exemplary embodiment of instantiation of a delay macro 700 in programmable logic. Delay macro 700 may be used to implement adjustable delay 306 of FIGS. 3A and 3B. A programmable interconnect point ("PIP") 701 is used to couple an output of a pipeline, such as pipeline 600, to a slice 702 of a CLB 710. A single slice may be used to provide an incremental delay of an output from a pipeline prior to providing such bit to an input bus of an embedded block. Thus, for example, a single slice 702 may be used to provide such delay.

Another PIP, namely PIP 703, may be used to couple the output of slice 702 to a pin of a bus of an embedded block 210. However, in this particular example, it is shown that slices 702 and 704 of CLB 710, as well as 712 and 714 of CLB 711, may be serially coupled to one another in two directions to form a delay chain.

Thus, it should be appreciated that delay macro 700 effectively implements a delay chain, the delay of which is adjustable by reprogramming programmable logic. Notably, although it is shown that one or more CLBs may be programmed to provide such a delay chain, other types of delay chains may be used for delay macro 700. For example, a tapped delay line is another form of a delay chain that may be used.

Returning to FIG. 3A, adjustable delay 306 may thus be programmed to provide an initial delay to bit 203D. This initial delay may be increased or decreased by reprogramming adjustable delay 306. Thus, a variety of different delay may be added to a bit 203 output from pipeline 305 for providing a delayed bit 203D to input bus 311. Delay macro 209 of FIGS. 2A and 2B, which may be delay macro 700 of FIG. 7, may be used to insert a delay block, such as adjustable delay 306, where the added delay is greater than the delay associated with the slowest sequential path within a design using embedded block 210, such that the path with the added delay block becomes what is generally known as the "critical path" of a design. The range of delays may be sufficient to determine a maximum frequency of operation of embedded block 210. Responsive to input 308, namely output 307 from pipeline 305 combined with delay bit 203D from adjustable delay 306, embedded block 210 provides an outcome vector 212 from output bus 312.

Figure 5A:
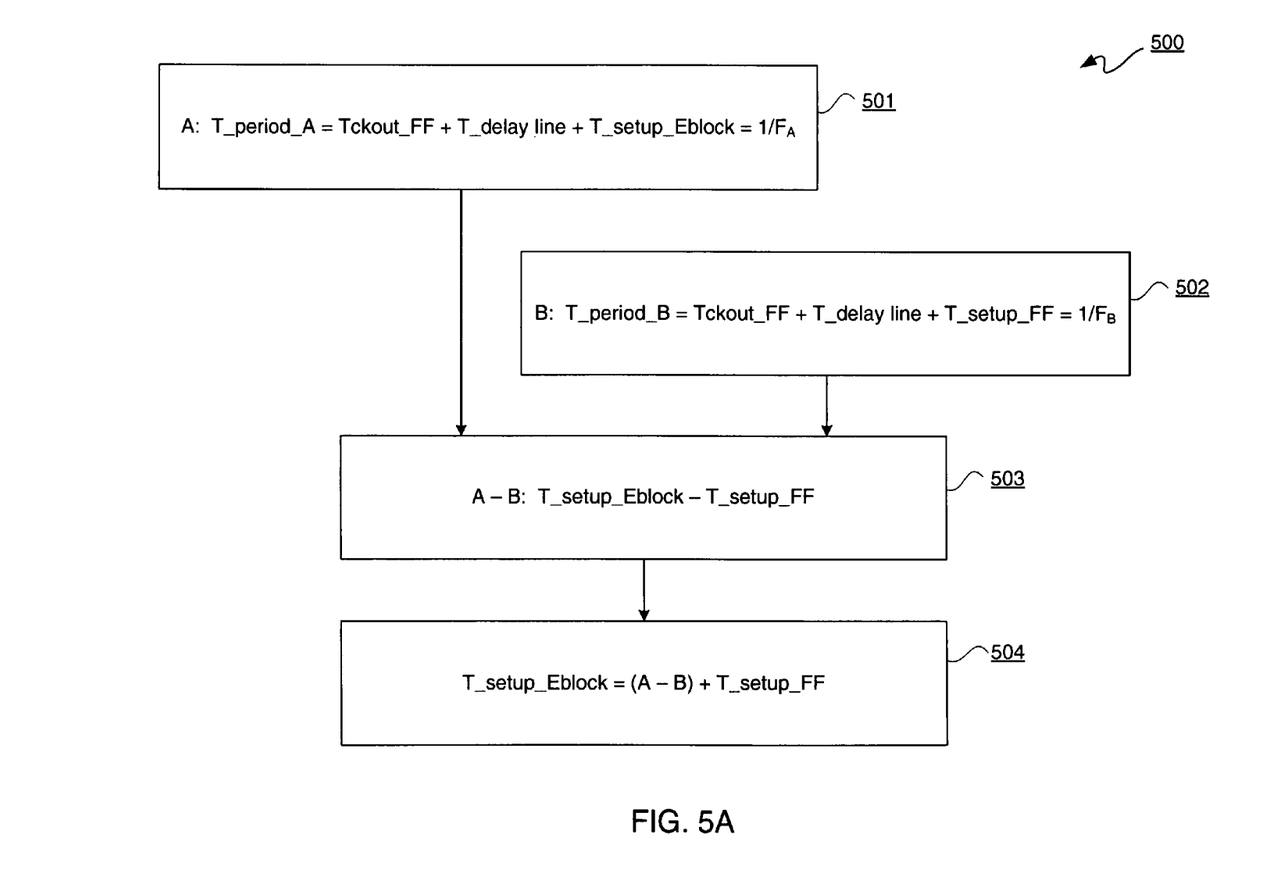
FIG. 5A is a flow diagram depicting an exemplary embodiment of a setup time calculation flow for an input side of an embedded block, such as the embedded block of FIG. 3A.

It should be appreciated that there is a delay associated with adjustable delay 306, a delay associated with pipeline 305, and a delay associated with embedded block 210, which in combination form a time interval 360, namely "T_period_A." FIG. 5A is a flow diagram depicting an exemplary embodiment of a setup time calculation flow 500. Setup time calculation flow 500 is for an input side of an embedded block, such as embedded block 210 of FIG. 3A. With simultaneous reference to FIGS. 3A and 5A, each of those figures is further described. Time interval 360, as indicated in block 501, includes a clock-to-output time of a flip-flop of pipeline 305 as associated with providing an output bit 203 to adjustable delay 306. Notably, clock-to-output timing of each of the flip-flops of pipeline 305 may be equal or at least substantially the same and may be known. Additionally, time interval 360 includes a delay associated with adjustable delay 306. Lastly, time interval 360 includes a delay associated with a setup time of a circuitry associated with an input pin of input bus 311 of embedded block 210. This input pin is associated with a path under test in embedded block 210.

Outcome vector 212, which may be an (M+1)-bit wide vector, namely [M:0], for M a positive integer greater than 0, may be provided to an optional pipeline 315 or may be provided directly to output control logic 314. Notably, depending on for example a difference in frequency between an input side and an output side of embedded block 210, M may be larger or smaller than N. Additionally, M may be equal to N. Output of optional pipeline 315 may be provided to output control logic 314.

Output control logic 314 may be coupled to memory 322. Memory 322 for an FPGA implementation may be BRAM. Memory 322 may include at least one expected vector 214 as associated with the at least one stimulus vector 202. Thus, output control logic 314 may cause memory 322 to output an expected vector 214 responsive to control signal 310. Expected vector 214, which may be the same bit width as outcome vector 212, may be provided to an optional pipeline 325 or directly provided to output control logic 314. Notably, optional pipelines 315 and 325 may be instantiated in programmable logic flip-flops. Output of optional pipelines 315 and 325 may be respectively provided to output control logic 314. Output control logic 314 may be configured to compare vectors 214 and 212 to provide a resultant vector 330, which indicates the result of such comparison. In other words, memory 322, pipelines 315 and 325, and output control logic 314 may be part of comparison circuit 220 of FIG. 2A, and delay macro 209 of FIG. 2A may instantiate pipelines 315 and 325 in programmable logic.

Figure 3B:
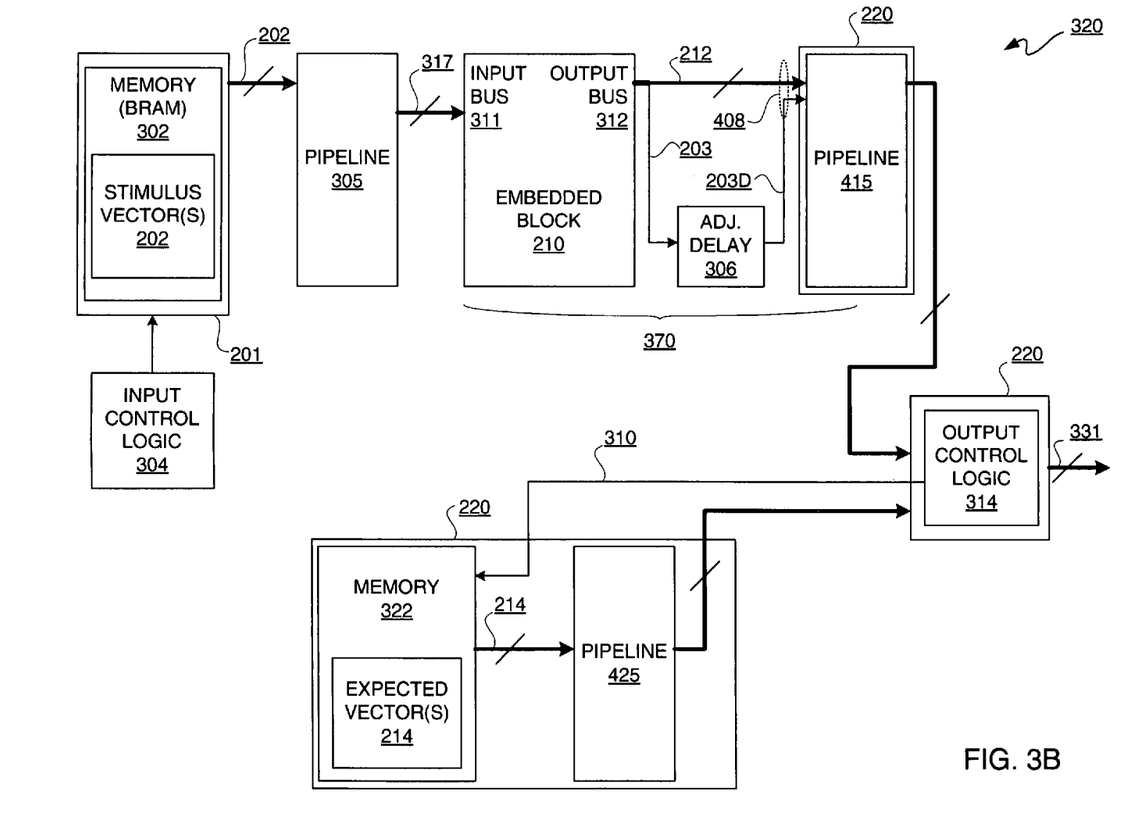
FIG. 3B is a block diagram depicting an exemplary embodiment of the output side BIST circuit of FIG. 2B.

With reference to FIG. 3B, FIG. 3B places adjustable delay 306 on the output side of embedded block 210. As many of the blocks of BIST circuit 320 of FIG. 3B are the same as those of BIST circuit 300 of FIG. 3A, the description of such blocks is not repeated for purposes of clarity. Stimulus vector 202 of FIG. 3B, which is output from memory 302 and provided to pipeline 305, is one bit less than stimulus vector 202 of FIG. 3A. In other words, pipeline vector 317 is [(N−1):0] bits in width. Accordingly, pipeline 305 of FIG. 3B may be one register stage less than pipeline 305 of FIG. 3A.

Pipeline vector 317 is provided to input bus 311 of embedded block 210. Pipeline vector 317 is one bit less than stimulus vector 202. In response to pipeline vector 317, embedded block 210 provides outcome vector 212. Outcome vector 212 has a bit 203 which is provided to adjustable delay 306. Notably, adjustable delay 306 of FIG. 3B need not be the same adjustable delay of FIG. 3A; however, for purposes of clarity by way of example and not limitation, a same adjustable delay 306 is used on both input and output sides of embedded block 210.

Notably, outcome vector 212, when output from embedded block 210, is (M+1) bits wide. In this example, M, [M:1], bits of outcome vector 212 are provided to pipeline 415. Memory 322, pipelines 415 and 425, and output control logic 314 may be part of comparison circuit 220 of FIG. 2B, and delay macro 209 of FIG. 2B may instantiate pipelines 415 and 425 in programmable logic. A bit 203 from output bus 312 of outcome vector 212 is provided to adjustable delay 306 for added delay. In this example, the 0th bit is used; however, any one of the (M+1) bits may have delay added to them. This bit 203 from outcome vector 212 has delay added to it by adjustable delay 306 to provide a delay bit 203D. Delayed bit 203D is added back into outcome vector 212, as generally indicated by dashed circle 408, and hereafter referred to as "outcome vector 408." Thus, output from output bus 312 is provided to pipeline 415, where one of the bits is delayed by adjustable delay 306 longer than all the other bits of outcome vector 221 to provide outcome vector 408 to pipeline 415. As described above, this additional delay may be adjustably increased to determine the maximum frequency of operation on an output side of embedded block 310.

Figure 5B:
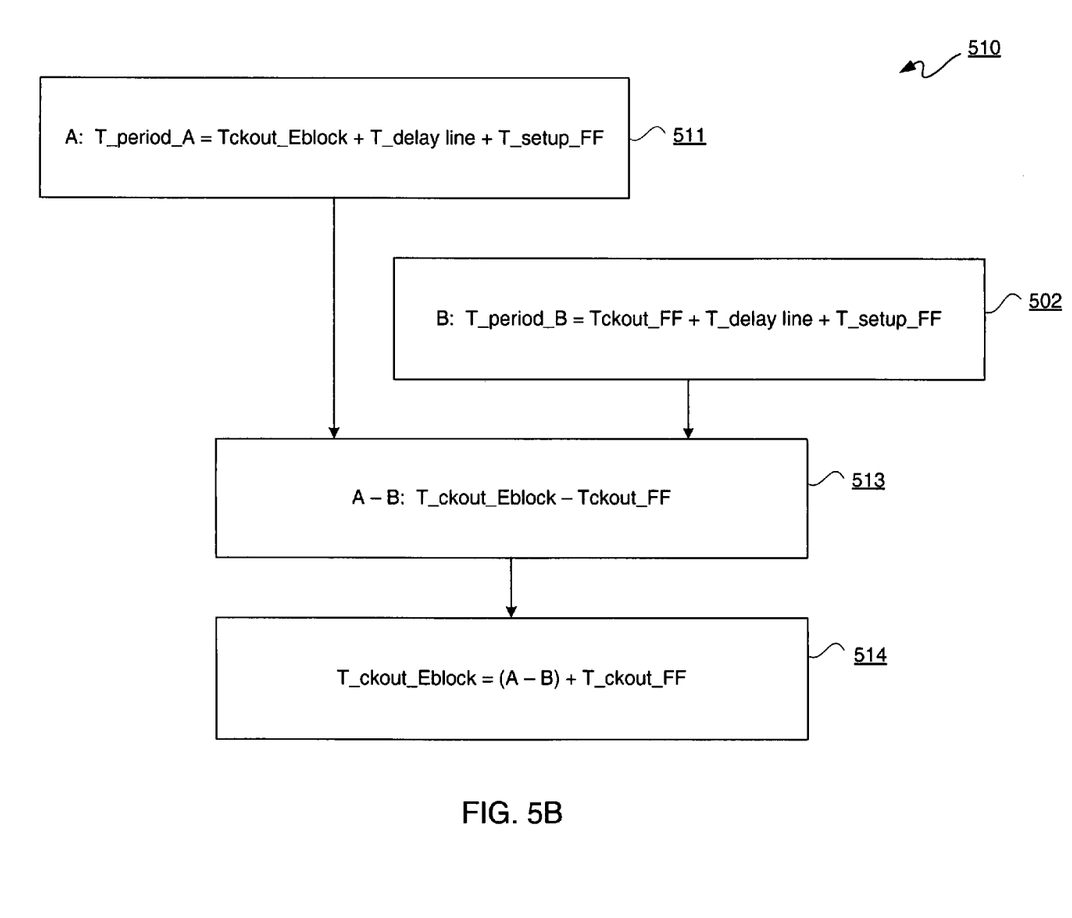
FIG. 5B is a flow diagram depicting an exemplary embodiment of a clock-to-output flow for an output side of an embedded block, such as the embedded block of FIG. 3B.

A time interval 370, namely T_period_A of FIG. 5B, as associated with embedded block 210, adjustable delay 306, and pipeline 415, may be determined. Referring to FIG. 5B, there is shown a flow diagram depicting an exemplary embodiment of a clock-to-output flow 510 for an embedded block, such as embedded block 210 of FIG. 3B. With simultaneous reference to FIGS. 3B and 5B, those FIGS. are further described.

Time interval 370 may include a clock-to-output time interval of embedded block 210. This clock-to-output time interval is associated with bit signal 203 as provided from output bus 312. Additionally, a delay of adjustable delay 306 may be included as part of time interval 370. Lastly, bit signal 203D as provided to pipeline 415 may have associated therewith a setup time of a flip-flop of pipeline 415 which may be included in time interval 370. Thus, as indicated in block 511, time interval 370, namely another "T_period_A," may be defined. Output of pipeline 415, which may be (M+1) bits wide, is provided to output control logic 314 as previously described. Memory 322 may have stored therein one or more expected vectors 214 as associated with stimulus vectors 202. Responsive to a control signal 310 from output control logic 314, memory 322 may output an expected vector 214 to pipeline 425. This expected vector 214 may be output from pipeline 425 to output control logic 314 for comparison with the output of pipeline 415 to provide resultant vector 331.

Thus, with reference to FIGS. 3A and 3B, it should be appreciated that delay of adjustable delay 306 may be set to determine a point at which the frequency of operation of embedded block 210, on an input or output side, respectively, is too great. Accordingly, a maximum frequency of operation may be determined for both an input side and an output side responsive to resultant vectors 330 and 331, respectively. Notably, at the point in time that a maximum frequency of operation is determined, the values of time intervals 360 and 370 when inverted indicate such maximum frequency of operation.

Figure 4:
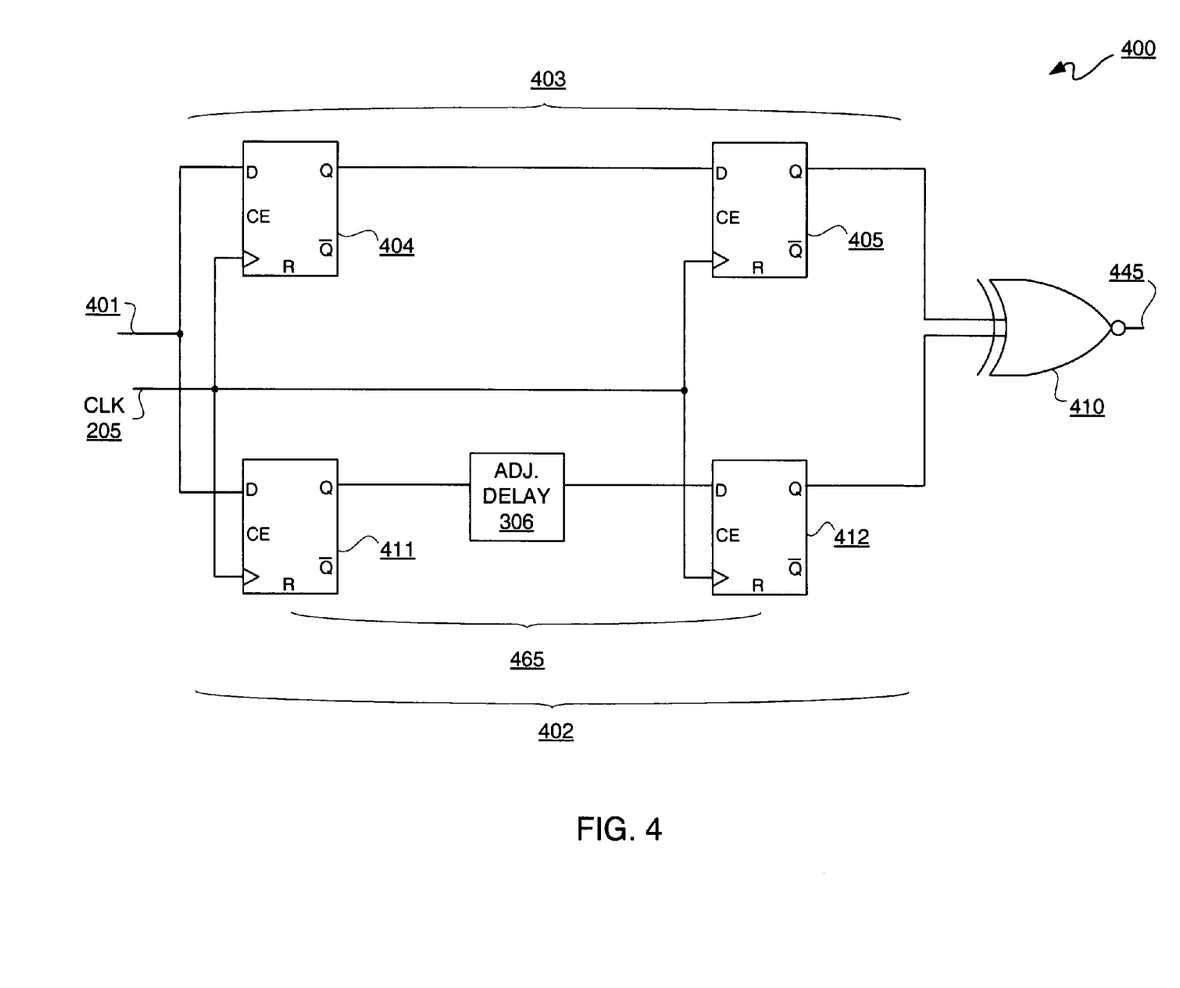
FIG. 4 is a schematic diagram depicting an exemplary embodiment of a reference design.

To mirror a path of a delay chain, such as implemented via delay macro 209 of FIGS. 2A and 2B, a reference design may be implemented. FIG. 4 is a schematic diagram depicting an exemplary embodiment of a reference design 400. An input 401 is provided to reference design 400. Input 401 is provided along separate parallel paths 402 and 403. Path 403 is a series of flip-flops, namely in this example flip-flops 404 and 405 coupled in series. The output of flip-flop 405 is provided as an input to an exclusive NOR ("XNOR") gate 410. With reference to path 402, input 401 is provided to an input flip-flop 411. The output of input flip-flop 411 is provided to an input port of adjustable delay 306. Notably, adjustable delay 306 is the same as used in either or both of FIGS. 3A and 3B. More particularly, adjustable delay 306 of FIG. 4 may be set to the same delay value used to determine a maximum frequency of operation, on either an input or output side or both, of embedded block 210 of FIGS. 2A and 2B. Output of adjustable delay 306 is provided to output flip-flop 412. Output of output flip-flop 412 is provided as another input to XNOR gate 410. Accordingly, setting adjustable delay 306 to a same delay used to determine a maximum frequency of operation of embedded block 210, may be used to determine a maximum frequency of operation of reference design 400. Thus, by clocking flip-flops 404, 405, 411, and 412 responsive to clock signal 205, where clock signal 205 is adjusted in frequency in order to determine when outputs of paths 403 and 402 are not equal to one another as indicated by result 445 output from XNOR gate 410. Thus, output 445 indicates when a maximum frequency of operation for reference design 400 has been determined.

With renewed reference to FIG. 5A and continuing reference to FIG. 4, a time interval 465 may be determined. More particularly, time interval 465 includes a clock-to-output time of flip-flop 411, a delay time interval of adjustable delay 306, and a setup time interval of flip-flop 412. Notably, for reference design 400, clock-to-output timing of flip-flop 411 and setup time of flip-flop 412 may be considered known intervals. Furthermore, it should be appreciated that an inverted value of time interval 465, namely "T_period_B," is associated with a maximum frequency of operation of reference design 400. This time interval 465 is indicated in each of blocks 502 of FIGS. 5A and 5B.

By subtracting the result obtained in block 502 from the result obtained in block 501 of FIG. 5A ("A-B"), the times of the delay lines, namely the delay associated with adjustable delay 306, will cancel out. Furthermore, assuming that all flip-flops in programmable logic have essentially the same clock-to-output timing, as well as setup timing, clock-to-output timing of flip-flops will also cancel out. Thus, the result of subtracting the time interval associated with block 502 from the time interval associated with block 501 results in a setup time of a flip-flop being subtracted from a setup time of embedded block 210 as indicated in block 503. Stated another way, as indicated in block 504, setup time of an embedded block for an input side, such as embedded block 210 of FIG. 3A, may be determined by subtracting the time interval as associated with block 501 from the time interval as associated with block 502 and adding to that result a setup time for a flip-flop. As a setup time for a flip-flop is known, once the maximum frequencies of operation are determined for BIST circuit 300 of FIG. 3A and reference design 400 of FIG. 4, those frequencies may be subtracted from one another. The result of the subtraction may have added to it a setup time of a flip-flop in order to determine the setup time associated with a target pin of an embedded block, such as an input pin of input bus 311 of embedded block 210 of FIG. 3A.

Likewise, with reference to FIG. 5B, the result of block 502 may be subtracted from the result of block 511 as indicated in block 513. Again, the delay associated with adjustable delay 306 in each instance will cancel out. Additionally, in this example, the setup time of the flip-flops will cancel out as well. This leaves the clock-to-output time interval of the embedded block, such as an output side of embedded block 210 of FIG. 3B, less the clock-to-output time of a flip-flop. As indicated in block 514, this may be rewritten to express that the clock-to-output timing of an embedded block is equal to the value obtained at 511 subtracted from the value obtained at 502, plus the clock-to-output time of a flip-flop. Again, the clock-to-output time of flip-flop is known. Thus, once a maximum frequency of operation of BIST circuit 320 of FIG. 3B is determined, and a maximum frequency of operation of a reference design 400 is determined, the maximum frequency of the reference design 400 may be subtracted from the maximum frequency of the BIST circuit 320; the clock-to-output timing of a flip-flop may be added to that result to determine the clock-to-output timing of an embedded block output pin, namely a target output pin of output bus 312 of embedded block 210 of FIG. 3B.

Figure 8:
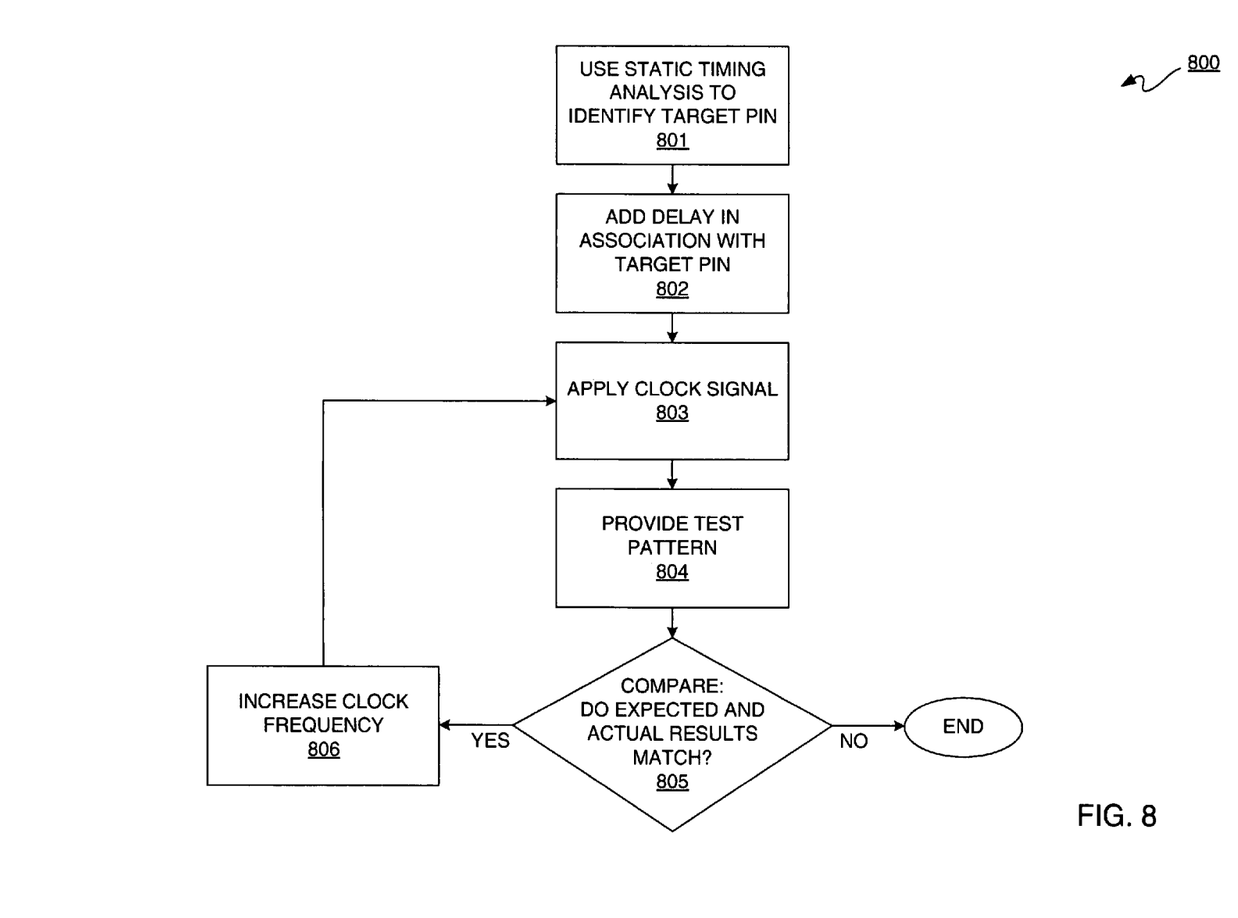
FIG. 8 is a flow diagram depicting an exemplary embodiment of a testing flow.

FIG. 8 is a flow diagram depicting an exemplary embodiment of a testing flow 800. At 801, a target pin is identified, such as of an input bus or an output bus of an embedded block coupled to a BIST circuit. At 802, a delay is added to one bit, as associated with the target pin identified at 801, in association with a stimulus vector that is input to the embedded block or output from the embedded block responsive to the stimulus vector. At 803 a clock signal having a frequency is applied. At 804, a test pattern, namely including the stimulus vector, is provided.

The clock frequency operates the embedded block and the BIST circuit being tested using the test pattern. At 805, the result of the test pattern run with the clock frequency obtained is compared with an associated expected result that may be stored in the comparison circuit of the BIST circuit. If the expected result and the actual result do not match, then generally a maximum frequency of operation may have been determined. If the expected and actual results match, then at 806 the clock frequency is increased and testing flow 800 resumes at 803 for the identified target pin. Notably, there may be a range of clock frequencies of operation, and thus testing may exhaust this range. Accordingly, delay may be increased, and the range of clock frequencies reused to continue testing. Cycles of testing flow 800 may be repeated with increasing clock frequencies until that clock frequency is found at which expected and actual results do not match.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A method for testing an integrated circuit, comprising:
obtaining a first vector having first multiple bits;
pipelining the first vector to provide a pipelined version of the first vector responsive to a clock signal;
providing a bit of the first multiple bits of the pipelined version of the first vector to a first adjustable delay;
providing a remainder of the first multiple bits of the pipelined version of the first vector to an input bus of an embedded circuit, the embedded circuit being provided as part of the integrated circuit;
adjustably delaying the bit with the first adjustable delay to provide a delayed bit that is delayed with respect to the remainder of the first multiple bits;
providing the delayed bit to the input bus of the embedded circuit;
wherein the first multiple bits including the delayed bit are provided to the input bus as a second vector;
outputting a third vector from the embedded circuit responsive to the second vector;
obtaining a fourth vector having second multiple bits; and
comparing the fourth vector with the third vector to determine a first period of delay associated with at least approximately a maximum operating frequency of the embedded circuit.

2. The method according to claim 1, wherein the first vector is a function verification vector for the embedded circuit; and
wherein the fourth vector is an expected result vector associated with the function verification vector.

3. The method according to claim 1, wherein the first adjustable delay is provided with programmable logic.

4. The method according to claim 3, wherein the pipelining is provided with flip-flops clocked responsive to the clock signal, the flip-flops being coupled to respectively receive the first multiple bits in parallel; and
wherein the embedded circuit is clocked responsive to the clock signal.

5. The method according to claim 4, wherein the programmable logic includes at least one slice of at least one configuration logic block for instantiating the first adjustable delay;
wherein the flip-flops are provided using the programmable logic; and
wherein the integrated circuit is a Field Programmable Gate Array.

6. The method according claim 1, further comprising:
providing a reference circuit in the integrated circuit, the reference circuit including a second adjustable delay;
adjusting delay of the second adjustable delay to determine a second period of delay associated with at least approximately a maximum operating frequency of the reference circuit; and
subtracting the second period of delay from the first period of delay and adding a setup time for a flip-flop of the flip-flops for determining a setup time of the embedded circuit.

7. The method according to claim 6, wherein the embedded circuit is selected from a group consisting of a microprocessor block, an Ethernet media access control block, and a Peripheral Component Interconnect block.

8. A method for testing an integrated circuit, comprising:
obtaining a first vector having first multiple bits by an input bus of an embedded circuit, the embedded circuit being provided as part of the integrated circuit;
outputting a second vector having second multiple bits from an output bus of the embedded circuit responsive to the first vector and to a clock signal;

providing a bit of the second multiple bits of the second vector to a first adjustable delay;

providing a remainder of the second multiple bits to a pipeline;

adjustably delaying the bit with the first adjustable delay to provide a delayed bit that is delayed with respect to the remainder of the second multiple bits;

providing the delayed bit to the pipeline;

wherein the second multiple bits including the delayed bit are provided to the pipeline as a third vector;

outputting the third vector from the pipeline responsive to the clock signal;

obtaining a fourth vector having third multiple bits; and comparing the fourth vector with the third vector being outputted from the pipeline to determine a first period of delay associated with at least approximately a maximum operating frequency of the embedded circuit.

9. The method according to claim 8, wherein the first vector is a function verification vector for the embedded circuit; and wherein the fourth vector is an expected result vector associated with the function verification vector.

10. The method according to claim 8, wherein the first adjustable delay is provided with programmable logic.

11. The method according to claim 10, wherein the pipeline is provided with flip-flops clocked responsive to the clock signal, the flip-flops being coupled to respectively receive the remainder of the second multiple bits and the delayed bit in parallel.

12. The method according to claim 11, wherein the programmable logic includes at least one slice of at least one configuration logic block for instantiating the first adjustable delay;

wherein the flip-flops are provided using the programmable logic; and wherein the integrated circuit is a Field Programmable Gate Array.

13. The method according claim 8, further comprising:

providing a reference circuit in the integrated circuit, the reference circuit including a second adjustable delay;

adjusting delay of the second adjustable delay to determine a second period of delay associated with at least approximately a maximum operating frequency of the reference circuit; and subtracting the second period of delay from the first period of delay and adding a clock-to-out time for a flip-flop of the flip-flops for determining a clock-to-out time of the embedded circuit.

14. The method according to claim 13, wherein the embedded circuit is selected from a group consisting of a microprocessor block, an Ethernet media access control block, and Peripheral Component Interconnect block.

15. A test system for an integrated circuit, comprising:

a first storage device for storing a first vector of a set of function verification vectors;

an embedded circuit under test;

a comparison circuit;

a second storage device for storing a set of expected results vectors associated with the set of function verification vectors;

a delay macro for programming programmable logic to provide a delay line, the delay line being programmable to adjust delay of the delay line;

the delay line programmably coupled to receive a bit signal and configured to provide a delayed bit signal;

the bit signal being from a first vector of the set of function verification vectors;

the storage device, the delay line, and the embedded circuit operated with reference to a same clock signal;

the embedded circuit coupled to receive the first vector with the delayed bit signal and configured to provide a second vector in response to the first vector with the delayed bit signal;

the comparison circuit coupled to receive the second vector and a third vector, the third vector being from the set of expected results vectors and being associated with the first vector; and the comparison circuit configured to compare the second vector with the third vector to identify at least approximately a first maximum frequency of operation of the embedded circuit for input to an input bus thereof.

16. The test system according to claim 15, wherein the integrated circuit comprises memory for storing the set of function verification vectors and the set of expected results vectors;

wherein at least a portion of the memory comprises the second storage device; and wherein the first storage device is a pipeline formed of flip-flops of the programmable logic.

17. The test system according to claim 15, wherein the delay macro configures programmable interconnects for receiving the bit signal and for providing the delayed bit signal to the embedded circuit.

18. The test system according to claim 15, wherein the delay line comprises at least one slice of at least one configuration block of a Field Programmable Gate Array.

19. The test system according to claim 15, further comprising a reference circuit instantiated in the programmable logic, the reference circuit including the delay line of the delay macro to identify at least approximately a second maximum frequency of operation of the reference circuit.

20. The test system according to claim 19, wherein the second maximum frequency is subtracted from the first maximum frequency along with addition of a flip-flop setup time to determine a setup time for the embedded circuit.

* * * * *